(12) United States Patent
Lu et al.

(10) Patent No.: US 11,094,523 B2
(45) Date of Patent: Aug. 17, 2021

(54) PROCESSING METHOD FOR WAFER

(71) Applicant: DISCO CORPORATION, Tokyo (JP)

(72) Inventors: Xin Lu, Tokyo (JP); Zach Powers, Tokyo (JP); Eric Eisenberg, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/696,048

(22) Filed: Nov. 26, 2019

(65) Prior Publication Data

US 2020/0168451 A1 May 28, 2020

(30) Foreign Application Priority Data

Nov. 27, 2018 (JP) .............................. JP2018-221014

(51) Int. Cl.
*H01L 21/02* (2006.01)
*H01L 21/428* (2006.01)

(52) U.S. Cl.
CPC .. *H01L 21/02016* (2013.01); *H01L 21/02013* (2013.01); *H01L 21/02024* (2013.01); *H01L 21/428* (2013.01)

(58) Field of Classification Search
CPC ......... H01L 21/02016; H01L 21/02024; H01L 21/428; H01L 21/304; H01L 21/02021; H01L 21/302; H01L 21/30625; H01L 21/3212–32125; H01L 21/461; H01L 41/337; H01L 2224/03602; H01L 2224/03616; H01L 2224/03845; H01L 21/76256; H01L 21/02013–02019; B23K 2103/56; B23K 26/53; B24B 9/065; B24B 37/04

See application file for complete search history.

(56) References Cited

U.S. PATENT DOCUMENTS

2018/0076043 A1\* 3/2018 Ito ...................... B23K 26/0823

FOREIGN PATENT DOCUMENTS

| JP | 2000173961 A | 6/2000 |
| JP | 2006108532 A | 4/2006 |

\* cited by examiner

*Primary Examiner* — Cuong B Nguyen
(74) *Attorney, Agent, or Firm* — Greer, Burns & Crain, Ltd.

(57) ABSTRACT

A processing method for a wafer having a chamfered portion on an outer circumference thereof includes a step of irradiating a laser beam of a transmission wavelength to the wafer along an outer circumferential edge of the wafer at a position on an inner side of a predetermined distance from the outer circumferential edge of the wafer to form an annular modified region having a depth from a front face of the wafer to a finish thickness, a step of irradiating a laser beam of a transmission wavelength to the wafer on an outer circumferential portion of the wafer to radially form a plurality of modified regions having the depth from the front face of the wafer to the finish thickness on the outer circumferential portion of the wafer, and a step of grinding a back face of the wafer to thin the wafer to the finish thickness.

4 Claims, 5 Drawing Sheets

PROCESSING METHOD FOR WAFER

BACKGROUND OF THE INVENTION

Field of the Invention

The present invention relates to a processing method for a wafer having a chamfered portion on an outer circumference.

Description of the Related Art

When a back face of a wafer is ground and thinned, there is the possibility that a so-called sharp edge may be formed at a chamfered portion on an outer circumference of the wafer, resulting in missing at the sharp edge and break of the wafer. In order to prevent this, so-called edge trimming for removing a chamfered portion with a cutting blade before grinding (for example, refer to Japanese Patent Laid-Open No. 2000-173961) is widely adopted.

However, since, in edge trimming, a thick blade having a width of approximately 1 mm is used in comparison with a cutting blade having, for example, a width of approximately 20 μm that is used in normal dicing and the wafer is cut not in a linear shape but in a circular shape, the cutting load is greater than that in normal dicing and missing called chipping or cracking is liable to appear on an edge of a cut groove formed on an outer circumferential edge of the wafer. Then, if a crack reaches a device, then since this breaks the device, this is a problem. On the other hand, if edge trimming is performed at a low speed in order to suppress chipping and cracking, then the productivity degrades.

Therefore, a method is proposed in which a laser beam is irradiated on a wafer to divide the wafer into an inner circumferential portion and an outer circumferential portion and the wafer is ground after the outer circumferential portion is removed (for example, refer to Japanese Patent Laid-Open No. 2006-108532).

SUMMARY OF THE INVENTION

However, the method disclosed in Japanese Patent Laid-Open No. 2006-108532 has a problem in that, since a step of removing an outer circumferential portion of a wafer is added, the productivity degrades.

Therefore, it is an object of the present invention to provide a processing method for a wafer in which, when a wafer having a chamfered portion on an outer circumference is processed, break of the wafer can be prevented without increasing a step of removing an outer circumferential portion of the wafer.

In accordance with an aspect of the present invention, there is provided a processing method for a wafer having a chamfered portion on an outer circumference edge thereof, including: an annular modified region formation step of irradiating a laser beam of a transmission wavelength to the wafer along the outer circumferential edge of the wafer at a position on an inner side of a predetermined distance from the outer circumferential edge of the wafer to form an annular modified region having at least a depth from a front face of the wafer to a finish thickness; an outer circumferential portion modified region formation step of irradiating a laser beam of a transmission wavelength to the wafer on an outer circumferential portion of the wafer to radially form a plurality of modified regions having at least the depth from the front face of the wafer to the finish thickness on the outer circumferential portion of the wafer; and a back face grinding step of grinding, after the annular modified region formation step and the outer circumferential portion modified region formation step are performed, a back face of the wafer to thin the wafer to the finish thickness, in which at the back face grinding step, the grinding proceeds while the outer circumferential portion of the wafer is being removed from the wafer from a start point given by the annular modified region and the plurality of modified regions.

Preferably, the processing method for a wafer of the present invention further includes a polishing step of polishing the back face after the back face grinding step is performed.

According to the processing method for a wafer according to the present invention, since the outer circumferential portion of the wafer is divided annularly by the annular modified region from an inner circumferential portion of the wafer during grinding, it can be prevented that the inner circumferential portion at which a device of the wafer is formed is broken by chipping or cracking that occurs at an edge of the wafer. Further, since the divided outer circumferential portion is divided finely by a plurality of outer circumferential portion modified regions extending radially, it can be removed during grinding.

Since the polishing step of polishing the back face is further provided after the back face grinding step is performed, flexural strength of the wafer can be enhanced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

In the following, steps of a processing method for a wafer according to an embodiment of the present invention are described.

(1) Annular Modified Region Formation Step

Figure 1:
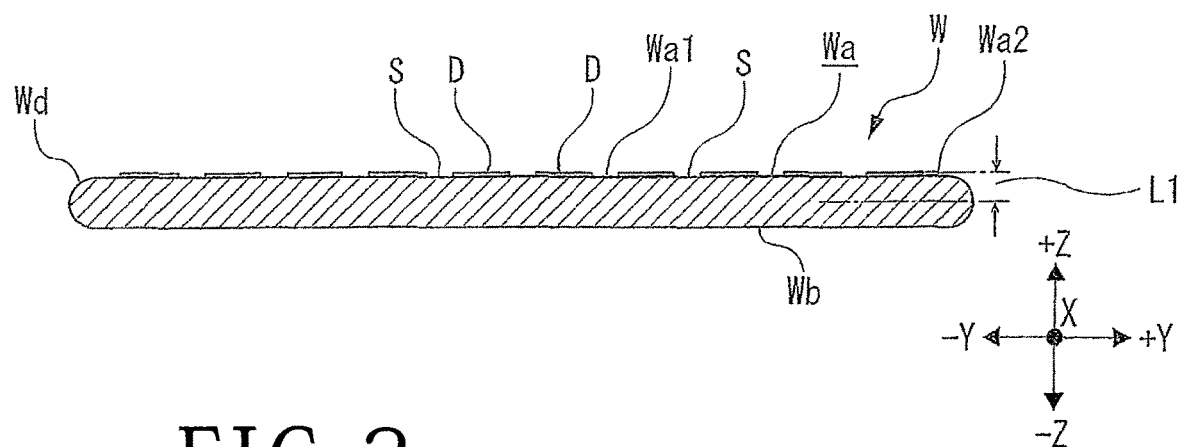
FIG. 1 is a sectional view depicting an example of a wafer.

A wafer W depicted in FIG. 1 is a semiconductor wafer that has a circular outer shape and is configured from silicon as a base material, and a device region Wa1 and an outer circumferential surplus region Wa1 surrounding the device region Wa1 are provided on a front face Wa of the wafer W. The device region Wa1 is partitioned in a grating by a plurality of scheduled division lines S orthogonally crossing with each other, and a device D such as an integrated circuit (IC) is formed in each of the regions partitioned in a grating. A back face Wb of the wafer W directed downwardly in FIG. 1 is used as a target grinding face that is ground later. The wafer W is chamfered at an outer circumferential edge thereof such that a chamfered portion Wd having a cross section of a substantially arcuate shape is formed. It is to be noted that the wafer W may be configured not only from silicon but also from gallium arsenide, sapphire, gallium nitride, silicon carbide or the like.

At the annular modified region formation step, a laser beam of a transmission wavelength to the wafer W is irradiated along the outer circumferential edge of the wafer W at a position on the inner side by a predetermined distance from the chamfered portion Wd that is the outer circumferential edge of the wafer W to form an annular modified region of a depth at least from the front face Wa of the wafer W to a depth corresponding to a finish thickness. In particular, the wafer W is transported, for example, to a laser processing apparatus 1 depicted in FIG. 2. The laser processing apparatus 1 includes at least a holding table 10 that sucks and holds the wafer W, and a laser beam irradiation unit 11 capable of irradiating a laser beam of a transmission wavelength to the wafer W held on the holding table 10. It is to be noted that, before the wafer W is transported to the laser processing apparatus 1, it is placed into a state in which a protective tape T is pasted to the front face Wa of the wafer W to protect devices D.

The holding table 10 is rotatable around an axis of the Z axis direction and is movable back and forth in the X axis direction that is a processing feeding direction and the Y axis direction that is an indexing feeding direction by moving means not depicted. The holding table 10 has, for example, a circular outer shape and is configured from a porous material. The holding table 10 includes a flattened holding face 10a that holds the wafer W thereon. Further, sucking force is generated by a suction source (not depicted) communicated with the holding face 10a and is transmitted to the holding face 10a such that the holding table 10 can suck and hold the wafer W on the holding face 10a thereof.

The laser beam irradiation unit 11 introduces a laser beam LB emitted from a laser oscillator 119 of yttrium aluminum garnet (YAG) or the like into a condenser lens 111a in the inside of a condenser 111 through an optical transmission system such that the laser beam LB can be condensed and irradiated upon the wafer W held on the holding table 10. The height position of a focus point p of the laser beam LB is adjustable in the Z axis direction by focus point position adjustment means not depicted.

The laser processing apparatus 1 includes alignment means 14 recognizing a coordinate position of the outer circumferential edge of the wafer W and a coordinate position of the center of the wafer W. The alignment means 14 includes a light source not depicted, and a camera 140 configured from an optical system for capturing reflected light from the wafer W, an imaging element for photoelectrically converting an image of an imaging object formed by the optical system to output image information, and so forth.

Figure 2:
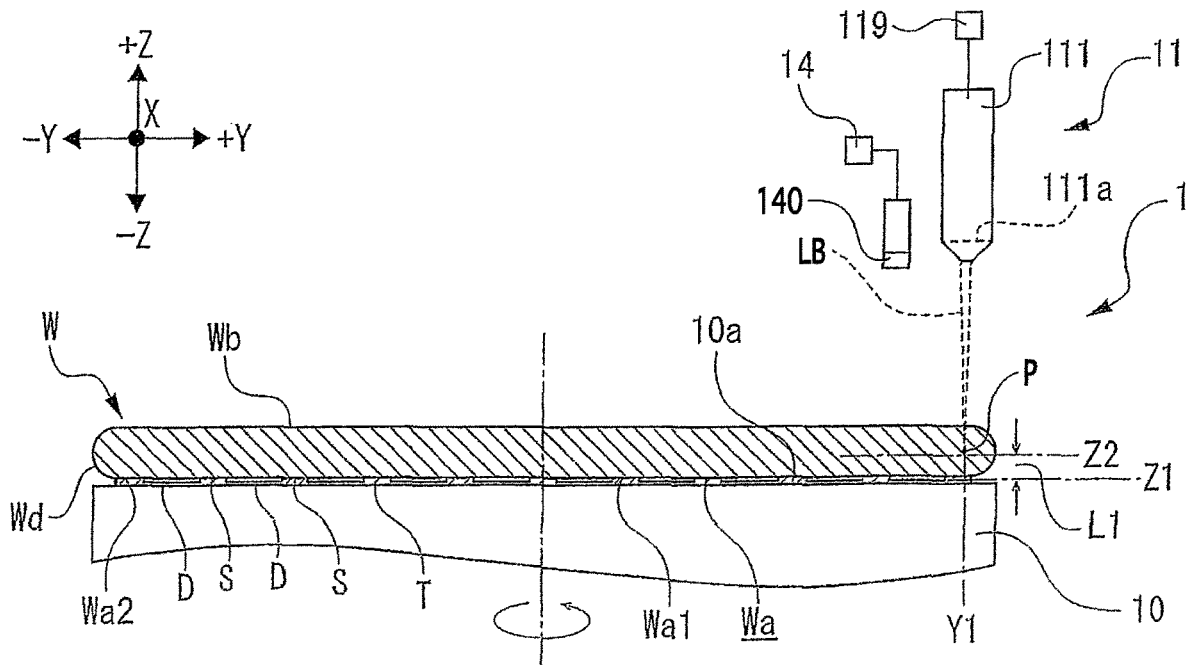
FIG. 2 is a sectional view depicting an annular modified region formation step.

As depicted in FIG. 2, the wafer W is placed on the holding face 10a of the holding table 10 such that the protective tape T pasted to the front face Wa is directed to the lower side, and the wafer W is sucked to and held by the holding table 10. The center of rotation of the holding table 10 and the center of the wafer W substantially coincide with each other.

The moving means not depicted moves the holding table 10 to a position below the alignment means 14 and edge alignment is carried out. In particular, the holding table 10 is rotated, and the outer circumferential edge of the wafer W held on the holding table 10 is imaged at a plurality of places thereof by the camera 140. Then, for example, coordinates of three points spaced from each other on the outer circumferential edge are detected from the captured image, and accurate coordinates of the center of the wafer W sucked to and held on the holding table 10 are determined by a geometrical arithmetic operation process based on the coordinates of the three points.

Then, on the basis of information of the coordinates of the center of the wafer W and information of a size of the wafer W recognized in advance, the holding table 10 is moved in a horizontal direction until it is positioned at a predetermined position such that a predetermined position Y1 on the inner side by a predetermined distance from the outer circumferential edge of the wafer W in the outer circumferential surplus region Wa2 is positioned just below the condenser 111.

Then, the focal point position of a laser beam to be condensed by the condenser lens 111a is positioned at a predetermined height position in the inside of the wafer W, for example, at a height position a little higher than a height position Z2 that corresponds to a depth at the finish thickness L1 of the wafer W depicted in FIG. 2. The finish thickness L1 is a thickness from a height position Z1 of the upper face of the devices D to the height position Z2. Then, a pulse laser beam of a transmission wavelength to the wafer W emitted from the laser oscillator 119 is condensed and irradiated upon the inside of the wafer W held on the holding table 10. It is to be noted that the output power of the laser beam is set, for example, to a condition that a crack is generated upwardly and downwardly from a modified layer formed in the wafer W.

Figure 3:
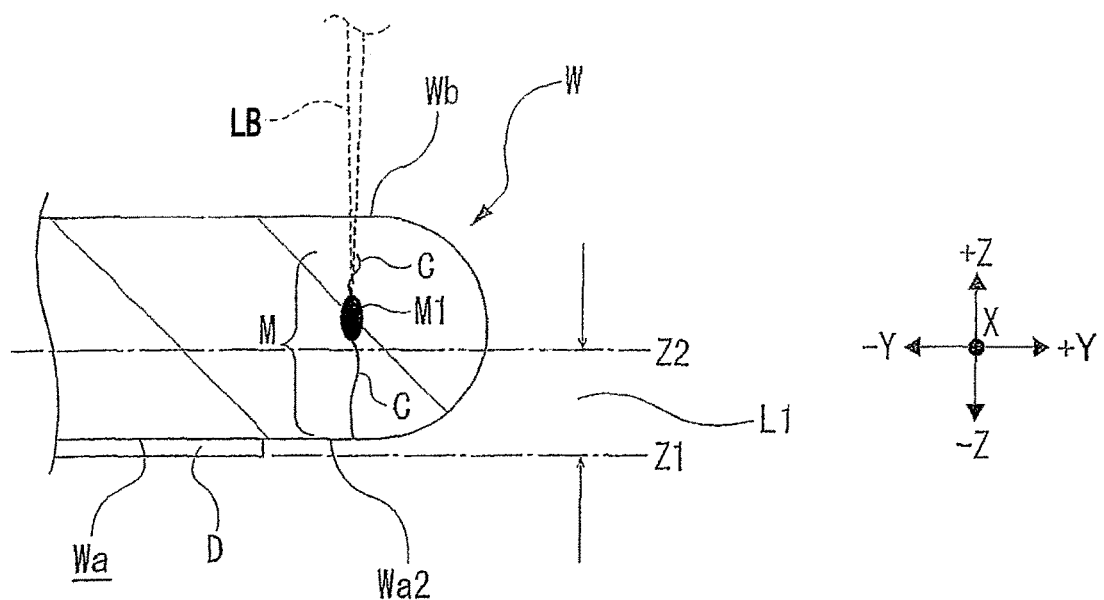
FIG. 3 is a sectional view depicting, in an enlarged scale, an annular modified region formed on the wafer.

If the laser beam emitted from the laser oscillator 119 is condensed and irradiated upon the inside of the wafer W, then a modified layer M1 depicted in FIG. 3 is formed in the wafer W such that it extends in the upward and downward directions from the focus point position. Further, since the output power of the laser beam is set such that a crack C is generated from the modified layer M1, fine cracks C are formed simultaneously in the upward and downward directions from the modified layer M1. In other words, a modified region M including the modified layer M1 and the cracks C is formed in the wafer W. In the example depicted in FIG. 3, a lower end of the crack C of the formed modified region M extends to the front face Wa of the wafer W.

By rotating the holding table 10 depicted in FIG. 2 by 360 degrees around the axis of the Z axis direction at a predetermined speed of rotation while a laser beam is irradiated along the outer circumferential edge of the wafer W, an annular modified region M extending at least from the front face Wa of the wafer W to the finish thickness L1, namely, to the height position Z2, is formed. It is to be noted that, by causing only the crack C to extend to the front face Wa of the wafer W without forming the modified layer M1 in a region within the finish thickness L1 of the wafer W as in the present embodiment, the modified layer M1 can be removed by later grinding without leaving the modified layer M1 in the wafer W, which is preferable.

The annular modified region formation step is not limited the present embodiment. For example, in such a case that the finish thickness L1 of the wafer W depicted in FIG. 2 is great or in a like case, the focal point position of the laser beam is positioned at a height position lower than the height position Z2 (at a height position rather near to the front face Wa side). Then, while the laser beam is irradiated along the outer circumferential edge of the wafer W, every time the holding table 10 is rotated by 360 degrees around the axis of the Z axis direction at the predetermined speed of rotation, the focal point position is displaced to the upper side or the lower side by a predetermined distance in the thickness direction (Z axis direction) of the wafer W while the laser beam is irradiated upon the wafer W by a plurality of passes. Then, an annular modified region M formed from the modified layer M1 and the cracks C at the first stage, an annular modified region M at the second stage, an annular modified region M at the third stage, and an annular modified region M at the fourth stage are formed.

As a result, by the four stages of annular modified regions M each configured from the modified layer M1 and the cracks C, an annular modified region M is formed such that it extends at least from the front face Wa of the wafer W to a depth corresponding to the finish thickness L1, namely, to the height position Z2. In this case, the cracks C at the stages are connected to the annular modified region M. Further, the modified layer M1 may be exposed to the front face Wa of the wafer W. It is to be noted that, although a processing condition is set such that the output power for the laser beam is lowered such that a crack C is not generated upwardly and downwardly from the modified layer M1 and not the cracks C but the modified layers M1 at the stages themselves may be connected to each other in the thicknesswise direction of the wafer W to form an annular modified region M, the connection of the cracks C at the stages to each other is efficient because an annular modified region M extending at least from the front face Wa of the wafer W to the depth corresponding to the finish thickness L1, namely, to the height position Z2, can be formed by laser beam irradiation by a smaller number of passes.

It is to be noted that, upon formation of the annular modified region M, not a laser beam is irradiated by a plural number of passes while the focal point position is successively displaced by the predetermined distance to the upper side or the lower side in the thicknesswise direction (Z axis direction) every time the holding table 10 is rotated by 360 degrees around the axis of the Z axis direction, but the laser beam emitted from the laser oscillator 119 depicted in FIG. 2 is branched into laser beams of different light paths by a beam splitter or the like such that the focal point positions of the laser beams of the different light paths are positioned at different positions from each other in the thicknesswise direction of the wafer W. Then, by rotating the holding table 10 once by 360 degrees around the axis of the Z axis direction at the predetermined speed of rotation, the inside of the wafer W is modified simultaneously at the plurality of focal point positions to form an annular modified region M extending at least from the front face Wa of the wafer W to the depth corresponding to the finish thickness L1, namely, to the height position Z2.

As a further different example of the annular modified region formation step, for example, by disposing a different lens above or below the condenser lens 111a depicted in FIG. 2 or by forming the condenser lens 111a, for example, as a condenser lens having a spherical aberration, it is made possible to position the focal point of the pulse laser beam so as to extend in the thicknesswise direction of the wafer W. Then, in a state in which the focal points extend linearly in the thicknesswise direction of the wafer W, pulse laser beams of a transmission wavelength to the wafer W are emitted from the laser oscillator 119 such that the pulse laser beams are condensed and irradiated on the inside of the wafer W.

It is to be noted that only it is sufficient if laser beams can be irradiated upon the wafer W in a state in which an aberration occurs in the optical axis direction, and therefore, a pulse laser beam having a predetermined divergence angle may be emitted from the laser oscillator 119 and condensed by the condenser lens 111a.

By the irradiation of a laser beam as described above, fine holes or cracks (not depicted) extending in the thicknesswise direction (Z axis direction) of the wafer W and an amorphous region that surrounds the fine holes or the cracks and extends in the thicknesswise direction of the wafer W are formed in the inside of the wafer W. In other words, so-called shield tunnels configured from fine holes or cracks and an amorphous region are formed in the wafer W.

Then, by rotating the holding table 10 by 360 degrees around the axis of the Z axis direction at the predetermined speed of rotation while a laser beam is irradiated upon the outer circumferential edge of the wafer W, annular shield tunnels extending at least from the front face Wa of the wafer W to the depth corresponding to the finish thickness L1, namely, to the height position Z2, may be formed.

(2) Outer Circumferential Portion Modified Region Formation Step

Figure 4:
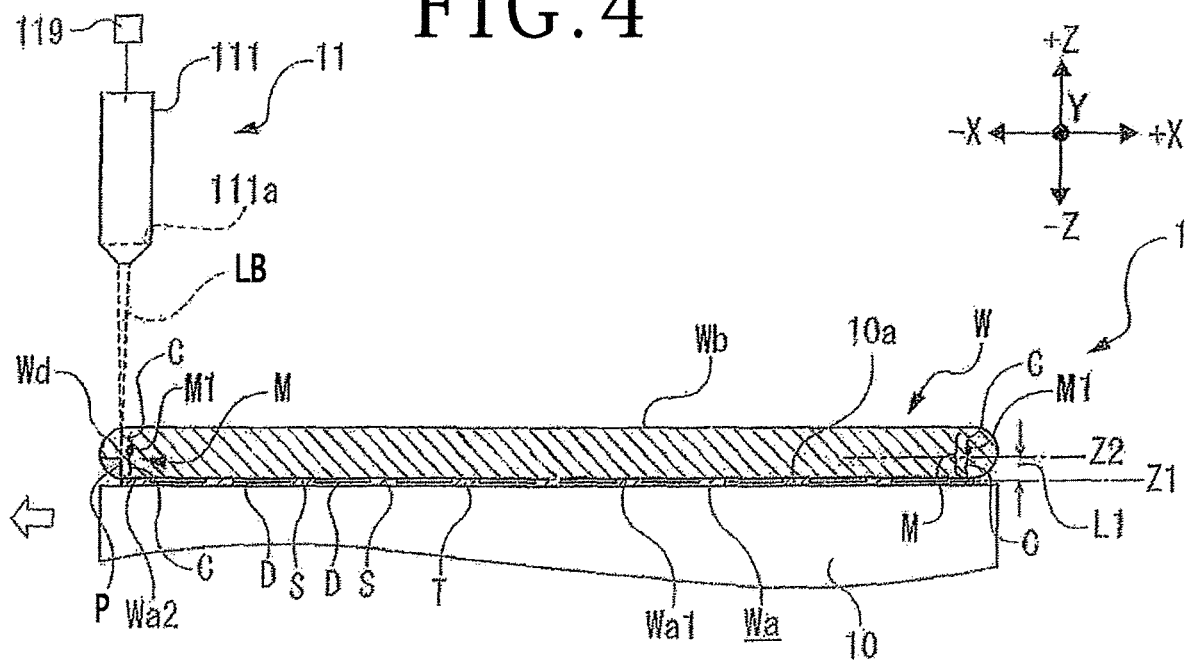
FIG. 4 is a sectional view depicting an outer circumferential portion modified region formation step.

For example, after the annular modified region M depicted in FIGS. 3 and 4 is formed on the wafer W, a laser beam of a transmission wavelength to the wafer W is irradiated upon an outer circumferential portion of the wafer W such that a plurality of modified regions having at least a depth from the front face Wa of the wafer W to the finish thickness L1 are formed radially on the outer circumferential portion of the wafer W. It is to be noted that the outer circumferential portion modified region formation step may otherwise be performed before the annular modified region formation step is carried out.

At the outer circumferential portion modified region formation step, the focus point position of the laser beam condensed by the condenser lens 111a is first positioned at a predetermined height position, for example, within the finish thickness L1 of the wafer W as depicted in FIG. 4. Then, a pulse laser beam of a transmission wavelength to the wafer W is emitted from the laser oscillator 119, and the laser beam is condensed and irradiated on the wafer W. Further, the wafer W is fed at a predetermined processing feed rate in the −X direction and the laser beam is irradiated from the outer circumferential edge of the wafer W toward the annular modified region M to form a modified region N having a depth from the front face Wa of the wafer W to the finish thickness L1, namely, to the height position Z2. The modified region N may include both of cracks not depicted and a modified layer, may otherwise include only a modified layer, or else may be shield tunnels.

Figure 5:
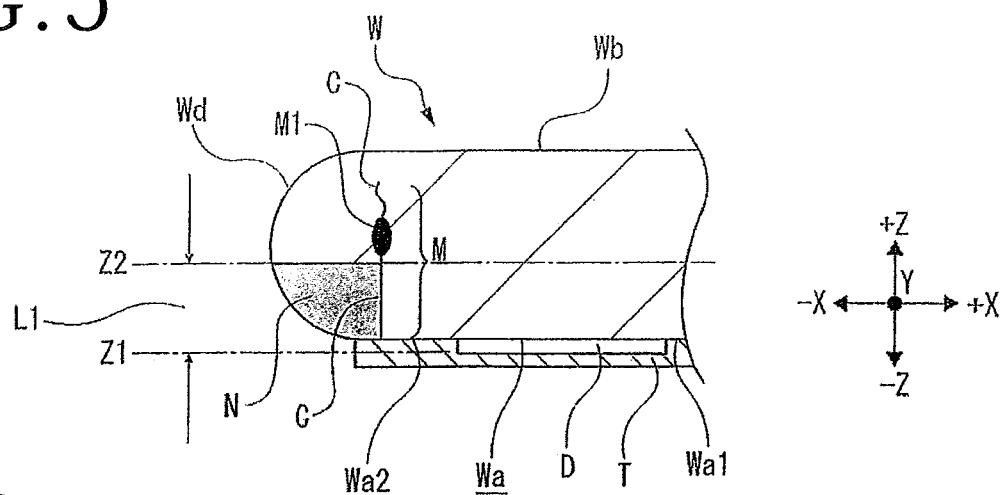
FIG. 5 is a sectional view depicting a modified region formed radially at an outer circumferential portion of the wafer in an enlarged scale.

For example, in the case where the finish thickness L1 of the wafer W depicted in FIG. 5 is 70 µm, the length of the modified region N in the Z axis direction is 70 µm that is a length equal to the finish thickness L1. On the other hand, the length of the annular modified region M in the Z axis direction is preferably 90 µm by further adding 20 µm to the finish thickness L1 (70 µm).

For example, as depicted in FIG. 5, if the wafer W advances in the −X direction that is a forward direction to a position at which the modified region N extents to the annular modified region M from the outer circumferential edge of the wafer W, then the irradiation of a laser beam is stopped and the holding table 10 is rotated around the axis of the Z axis direction by a predetermined angle (for example, several degrees). It is to be noted that the modified region N may not extend to the annular modified region M from the outer circumferential edge of the wafer W but stop before the annular modified region M.

Figure 6:
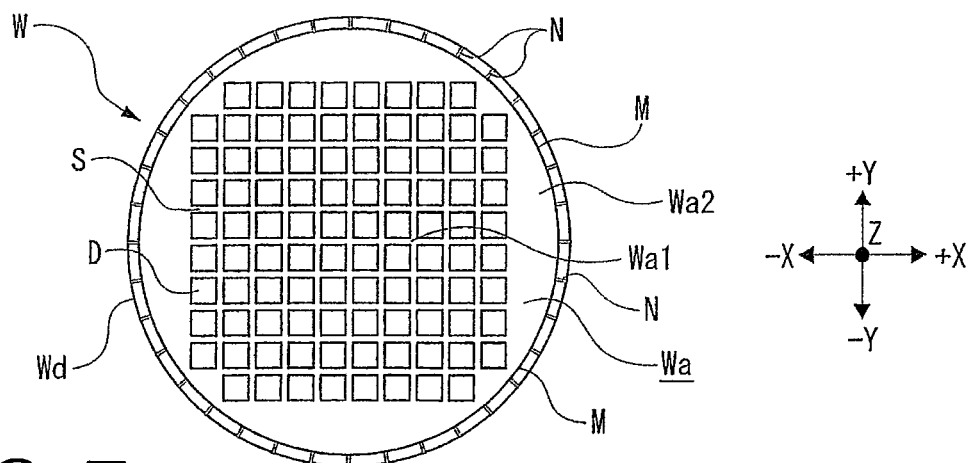
FIG. 6 is a top plan view depicting the wafer having the modified region formed radially over an overall circumference of an outer circumference.

Then, the wafer W depicted in FIG. 4 is processing fed in the +X direction that is a backward direction, and the modified region N is formed such that it extends from the annular modified region M to the outer circumferential edge of the wafer W by laser beam irradiation. By performing similar laser beam irradiation sequentially while the holding table 10 is successively rotated by a predetermined angle, a plurality of modified regions N having at least a depth from the front face Wa of the wafer W to the finish thickness L1 are formed radially over a substantially overall circumference of the wafer W as depicted in FIG. 6.

It is to be noted that the modified region N extending from the front face Wa of the wafer W depicted in FIG. 4 to the finish thickness L1, namely, to the height position Z2, may be formed by irradiating a laser beam by a plural number of passes on the wafer W while the focus point position is sequentially displaced by a predetermined distance to the upper side or the lower side in the forward and backward directions along the same line to thereby form modified regions at a plurality of stages.

(3) Back Face Grinding Step

After the annular modified region formation step and the outer circumferential portion modified region formation step are carried out, the back face Wb of the wafer W is ground to reduce the thickness to the finish thickness L1. In particular, the wafer W on which the annular modified region M and the modified region N are formed is transported to a chuck table 75 of a grinding apparatus 7 depicted in FIG. 7, and is sucked to and held on a holding face 75a of the chuck table 75 with the back face Wb directed to the upper side.

Figure 7:
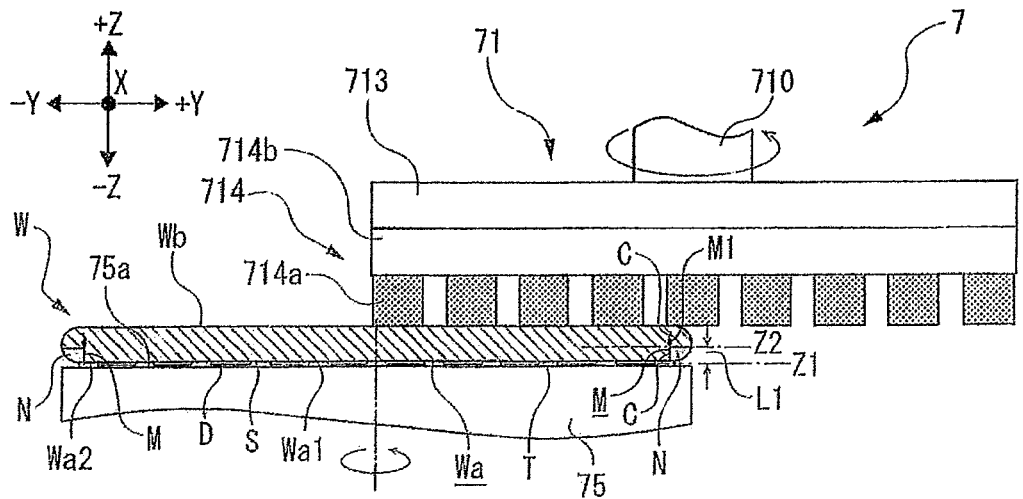
FIG. 7 is a sectional view depicting a state in which grinding of a back face of the wafer is started.

The grinding apparatus 7 depicted in FIG. 7 includes grinding means 71 grinding the wafer W. The grinding means 71 includes a rotary shaft 710 whose axial direction is the Z axis direction, a disk-shaped mount 713 connected to a lower end of the rotary shaft 710, and a grinding wheel 714 removably connected to a lower face of the mount 713. The grinding wheel 714 includes a wheel base 714b and a plurality of grindstones 714a of a substantially parallelepiped shape disposed annularly on a bottom face of the wheel base 714b.

First, the chuck table 75 is moved in the +Y direction until the chuck table 75 is positioned such that the center of rotation of the grindstones 714a is displaced in a horizontal direction by a predetermined distance with respect to the center of rotation of the wafer W and the locus of rotation of the grindstones 714a passes the center of rotation of the wafer W. Then, together with rotation of the rotary shaft 710, the grinding wheel 714 rotates around the axis thereof extending in the Z axis direction. Further, the grinding means 71 is fed in the −Z direction until the grindstones 714a are brought into contact with the back face Wb of the wafer W, and grinding processing is performed. During grinding, since also the wafer W rotates together with the rotation of the chuck table 75, the grindstones 714a performs grinding processing for the overall area of the back face Wb of the wafer W. Further, grinding water is supplied to the contacting places between the grindstones 714a and the back face Wb of the wafer W, and cooling of the contacting place and washing and removal of grinding scrap by the grinding water are performed.

Figure 8:
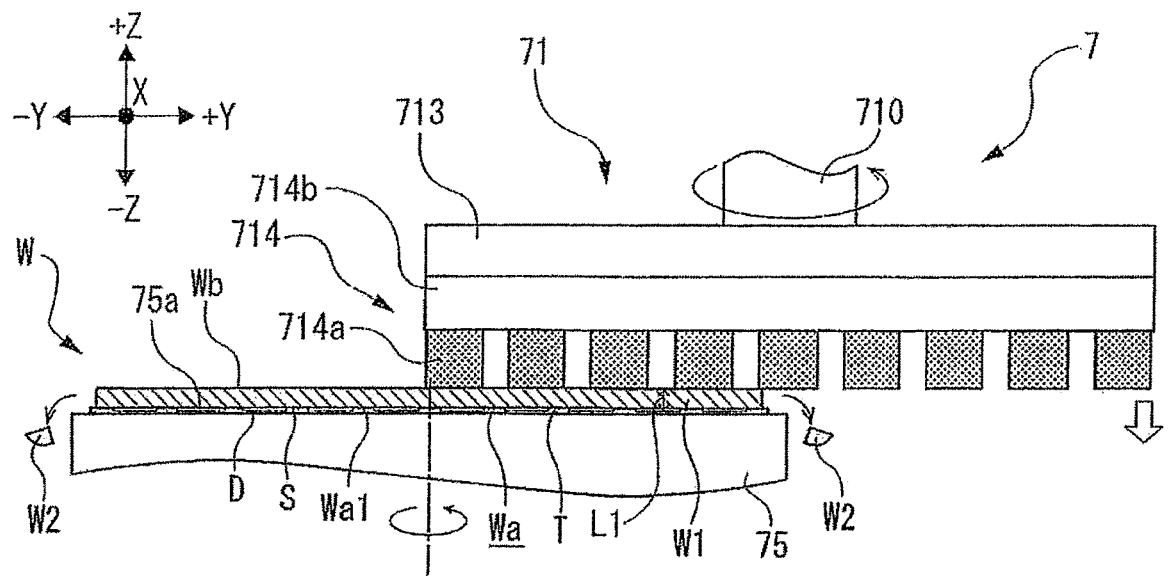
FIG. 8 is a sectional view depicting a state in which, at a back face grinding step, grinding progresses while the outer circumferential portion of the wafer is being removed from the wafer from a start point given by the annular modified region and a plurality of modified regions.

During grinding processing, grinding pressure in the −Z direction is applied from the grindstones 714a to the wafer W. As the back face Wb is ground as depicted in FIG. 8, grinding stress against the grinding pressure is generated along the annular modified region M, and the wafer W is divided into a circular inner circumferential portion W1 and an annular outer circumferential portion from a start point given by the annular modified region M. Then, after the grinding is continued until the wafer W is ground to the finish thickness L1 while the modified layer M1 of the annular modified region M is removed, the grinding means 71 is moved in the +Z direction so as to be spaced away from the wafer W.

Further, during the back face grinding processing, grinding stress against grinding pressure is generated along the plurality of modified regions N formed radially on the outer circumferential portion of the wafer W, by which the annular outer circumferential portion separated from the circular inner circumferential portion W1 of the wafer W is divided into fine end pieces W2 (for example, end pieces of a substantially trapezoidal shape as viewed in plan) depicted in FIG. 8 from the start point given by the modified regions N. Further, since the chuck table 75 is rotating, the end pieces W2 are removed from the chuck table 75 by centrifugal force.

As described above, in the processing method for a wafer according to the present invention, before grinding of the back face Wb of the wafer W, the annular modified region M and the modified regions N extending radially on the outer circumferential portion are formed on the wafer W. Then, since the outer circumferential portion of the wafer W is annually divided from the inner circumferential portion W1 of the wafer by the annular modified region M during grinding, the inner circumferential portion W1 on which the devices D of the wafer W are formed can be prevented from being broken by missing or cracking generated at an edge of the wafer W. Further, since the divided outer circumferential portion is divided finely by the plurality of modified regions N extending radially, it can be removed during grinding.

(4) Polishing Step

For example, in the present embodiment, after the back face grinding step is carried out, the back face Wb of the wafer W is polished. In particular, the inner circumferential portion W1 of the wafer W is transported to a chuck table 85 of a polishing apparatus 8 depicted in FIG. 9, and is sucked to and held on a holding face 85a of the chuck table 85 with the back face Wb thereof directed to the upper side.

Polishing means 80 of the polishing apparatus 8 includes a spindle 800 having, for example, an axial direction in the vertical direction (Z axis direction), a mount 801 in the form of a circular plate fixed to a lower end of the spindle 800, and a polishing pad 802 of a circular shape removably attached to a lower face of the mount 801. The polishing pad 802 is configured from non-woven fabric such as felt, and has a through-hole formed at a central portion thereof such that slurry passes through the same. Further, the polishing pad 802 has a lower face formed as a polishing face for polishing the wafer W. The diameter of the polishing pad 802 is set greater than the diameter of the wafer W.

For example, in the inside of the spindle 800, a slurry flow path extending in the Z axis direction is formed, and slurry supplying means is communicated with the slurry flow path. Slurry is jetted downwardly from an opening at the lower end of the slurry flow path toward the polishing pad 802 such that it comes to a contacting location between the polishing face of the polishing pad 802 and the wafer W. The slurry used in the polishing processing is solution containing, for example, silicon dioxide ($SiO_2$), aluminum oxide ($Al_2O_3$), cerium (IV) oxide ($CeO_2$), silicon carbide (SiC), zirconium dioxide ($ZrO_2$), titanium (II) oxide (TiO) or the like as loose abrasive. It is to be noted that, at the polishing step, not a chemical mechanical polishing method that uses slurry, so-called chemical mechanical polishing (CMP), but dry polishing that does not use slurry, may be performed.

First, the chuck table 85 is moved in the +Y direction to perform positioning between the polishing pad 802 and the wafer W held on the chuck table 85. The positioning is performed such that, for example, the polishing face of the polishing pad 802 covers the overall back face Wb of the wafer W.

Figure 9:
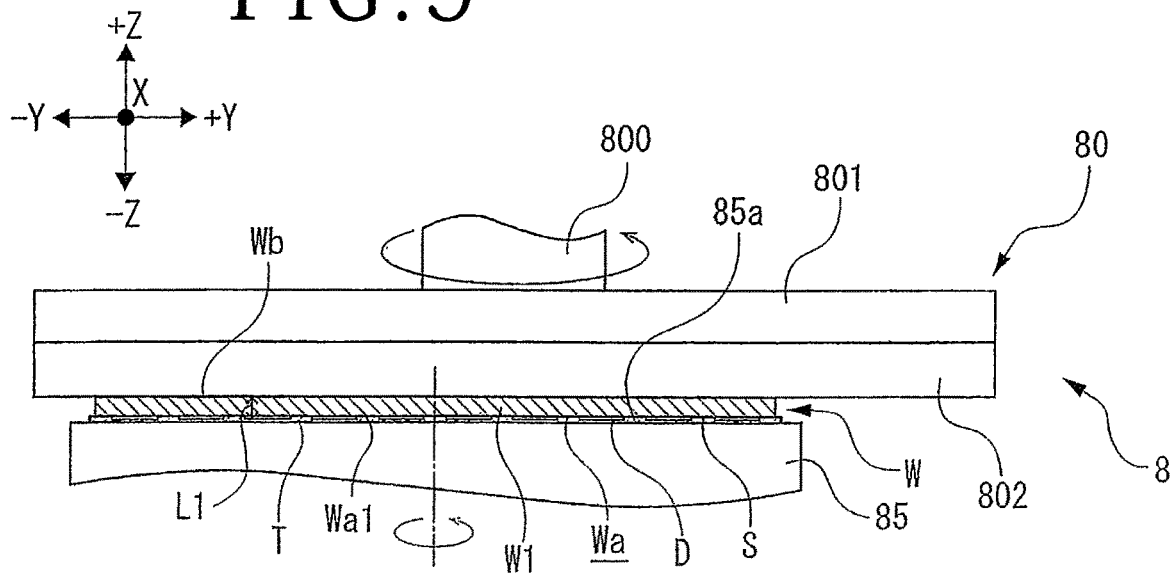
FIG. 9 is a sectional view depicting a state in which the back face of the wafer is polished.

After the positioning between the polishing pad 802 and the wafer W is performed, the polishing pad 802 is rotated. Further, the polishing means 80 is fed in the −Z direction, and the polishing face of the polishing pad 802 that is rotating is contacted with the wafer W to perform polishing processing as depicted in FIG. 9. During the polishing processing, since also the wafer W held on the chuck table 85 rotates together with rotation of the chuck table 85, the polishing pad 802 performs polishing processing of the overall area of the back face Wb of the wafer W.

During the polishing processing, since slurry is supplied to a location between the back face Wb of the rotating wafer W and the polishing face of the polishing pad 802, the polishing proceeds such that processing distortion is removed from the back face Wb of the wafer W by both a chemical action by the slurry and a mechanical action by rotation of the polishing pad 802, and the flexural strength of the wafer W is increased. After the wafer W is polished for a predetermined period of time, the polishing means 80 is moved in the +Z direction so as to be spaced away from the wafer W.

The processing method for a wafer according to the present invention is not limited to the present embodiment, and it is a matter of course that it may be carried out in various forms without departing from the technical idea of the present invention. Further, also the configurations of the laser processing apparatus 1, the grinding apparatus 7, and the polishing apparatus 8 depicted in the accompanying drawings are not limited to those of the present embodiment and can be changed suitably within a range within which the effects of the present invention can be demonstrated.

For example, for a wafer W depicted in FIG. 10 for which the annular modified region formation step and the outer circumferential portion modified region formation step described hereinabove have been carried out, before the back face grind step is carried out, the protective tape T is exfoliated from the front face Wa of the wafer W and a carrier wafer T2 (support wafer T2) having a diameter substantially equal to that of the wafer W is bonded to the front face Wa with bonding agent T1. For the carrier wafer T2, a wafer configured from a material similar to that used, for example, for the wafer W may be used. By bonding the wafer W to the different carrier wafer T2 to form a bonded wafer and performing processing handling the bonded wafer as a unitary member, the handling performance of the wafer W that is thin is improved and warp or damage of the wafer W upon processing can be prevented.

It is to be noted that, before the annular modified region formation step and the outer circumferential portion modified region formation step are carried out, the carrier wafer T2 may be bonded to the front face Wa of the wafer W. Further, the carrier wafer T2 may be joined directly to the front face Wa of the wafer W without using a bonding agent by an atomic diffusion bonding method, a surface activated room temperature bonding method, a bonding method in which heating of the wafer W is used or the like. Further, a carrier plate made of glass, sapphire, a metal plate or the like may be used in place of the carrier wafer T2.

Figure 10:
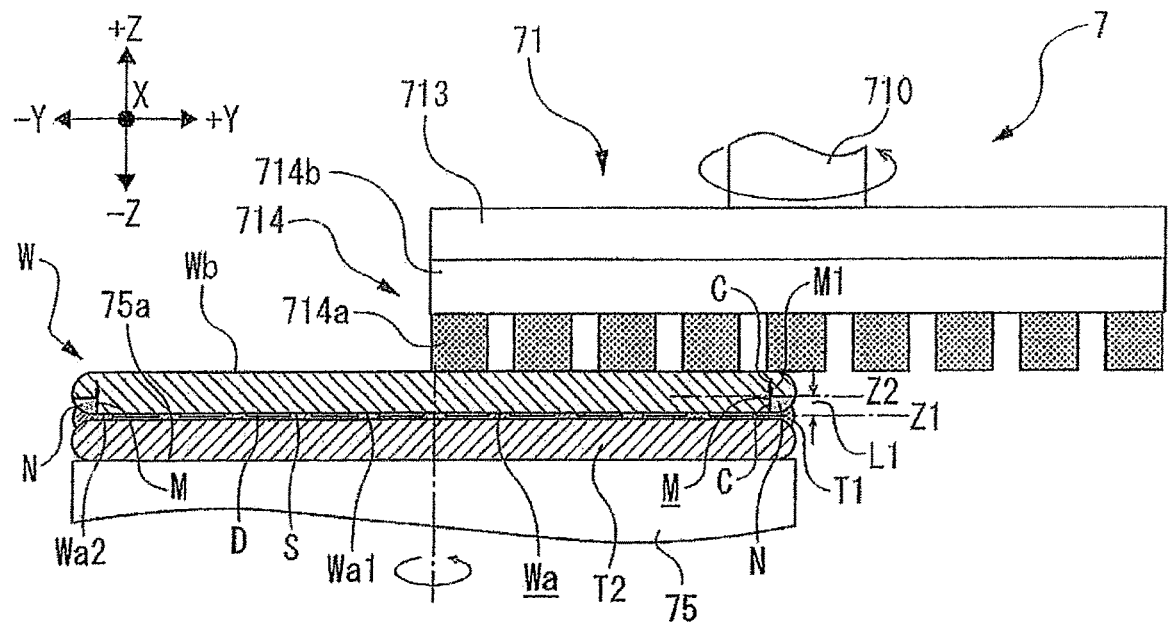
FIG. 10 is a sectional view depicting a state in which the back face of the wafer on which the annular modified region and the plurality of modified regions are formed and which has a carrier wafer bonded to the front face is ground.

The wafer W to which the carrier wafer T2 is bonded is transported to the chuck table 75 of the grinding apparatus 7 depicted in FIG. 10 and is sucked to and held on the holding face 75a of the chuck table 75 with the back face Wb thereof directed to the upper side. Then, the chuck table 75 is positioned such that the locus of rotation of the grindstones 714a passes the center of rotation of the wafer W. The grinding means 71 is fed in the −Z direction and the rotating grindstones 714a is contacted with the back face Wb of the wafer W to perform grinding processing. During grinding, since also the wafer W rotates together with rotation of the chuck table 75, the grindstones 714a perform grinding processing over the overall area of the back face Wb of the wafer W.

During the grinding processing, grinding pressure is applied in the −Z direction from the grindstones 714a to the wafer W. Then, grinding stress against the grinding pressure is generated along the annular modified region M, and the wafer W is divided into the circular inner circumferential portion W1 (refer to FIG. 11) and the annular outer circumferential portion from the start point given by the annular modified region M. Then, the wafer W is polished to the finish thickness L1 while the modified layer M1 of the annular modified region M is removed.

Further, during the back face grinding processing, grinding stress against the grinding pressure is generated along the plurality of modified regions N formed radially on the outer circumferential portion of the wafer W, and the annular circumferential portion of the wafer W separated from the circular inner circumferential portion W1 is divided into fine end pieces from the start point given by the modified regions N and removed.

Figure 11:
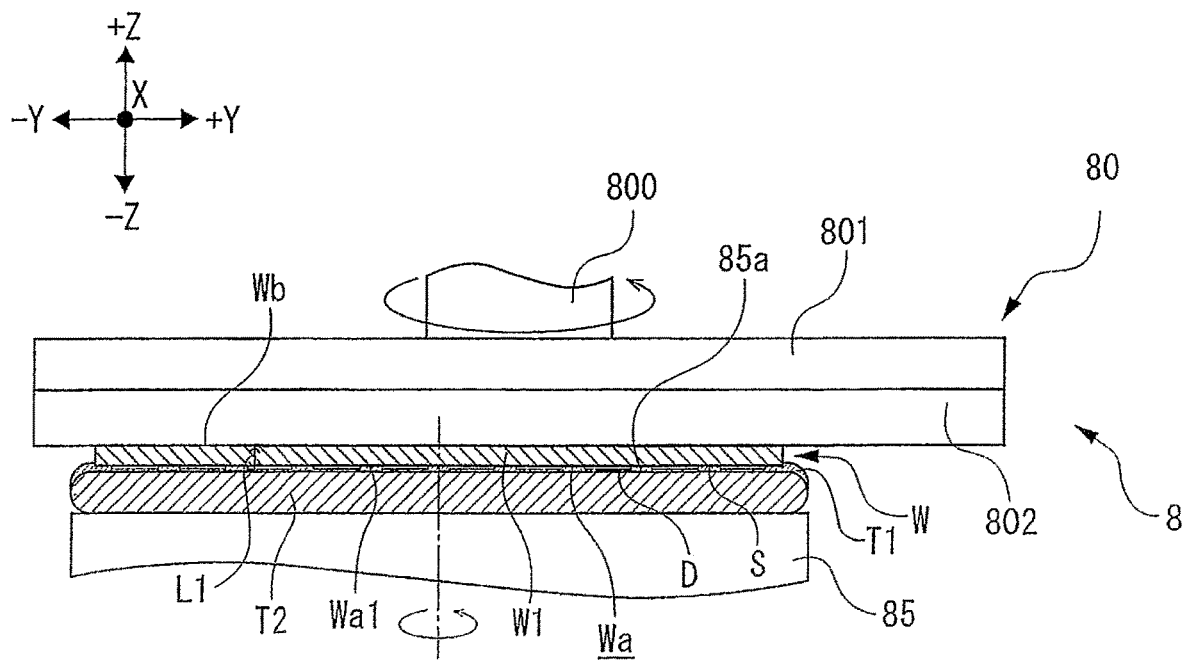
FIG. 11 is a sectional view depicting a state in which the back face of the wafer on which the annular modified region and the plurality of modified regions are formed and which has the carrier wafer bonded to the front face is polished.

Then, the inner circumferential portion W1 of the wafer W is transported to the chuck table 85 of the polishing apparatus 8 depicted in FIG. 11, and is sucked to and held on the holding face 85a of the chuck table 85 with the back face Wb thereof directed to the upper side. Since the wafer W is supported by the carrier wafer T2, it is prevented from being deformed and broken upon transportation after it is thinned.

For example, after positioning of the polishing pad 802 and the wafer W is performed such that the polishing face of the polishing pad 802 covers the overall area of the back face Wb of the wafer W, the polishing means 80 is fed in the −Z direction and the polishing face of the rotating polishing pad 802 is contacted with the wafer W to perform polishing processing as depicted in FIG. 11. During the polishing processing, while slurry is supplied to a contacting location between the polishing pad 802 and the wafer W, the rotating polishing pad 802 performs polishing processing of the overall area of the back face Wb of the rotating wafer W. Then, after the wafer W is polished for a predetermine period of time, the polishing means 80 is moved in the +Z direction so as to be spaced away from the wafer W.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer having a chamfered portion on an outer circumference edge thereof, the method comprising:
   an annular modified region formation step of irradiating a laser beam of a transmission wavelength to the wafer along the outer circumferential edge of the wafer at a point that is a predetermined distance from the outer circumferential edge of the wafer to form an annular modified region having at least a depth from a front face of the wafer that is equal to a finished thickness of the wafer;
   an outer circumferential portion modified region formation step of irradiating a laser beam of a transmission wavelength to the wafer on an outer circumferential portion of the wafer to radially form a plurality of modified regions having at least the depth from the front face of the wafer to the finished thickness of the wafer on the outer circumferential portion of the wafer;
   a back face grinding step of grinding, after the annular modified region formation step and the outer circumferential portion modified region formation step are performed, a back face of the wafer to thin the wafer to the finish thickness of the wafer,
   wherein at the back face grinding step, the grinding proceeds while the outer circumferential portion of the wafer is being removed from the wafer based on the annular modified region and the plurality of modified regions; and
   a polishing step of polishing the back face after the back face grinding step is performed.

2. The processing method for a wafer according to claim 1, further comprising forming cracks in the wafer that extend upwardly and downwardly from the annular modified region.

3. The processing method for a wafer according to claim 1, wherein the annular modified region extending in a thickness direction of the wafer, wherein the annular modified region includes an amorphous region that surrounds a fine hole.

4. The processing method for a wafer according to claim 1, further comprising attaching a protective tape to a front face of the wafer.

* * * * *